United States Patent [19]

Matsuura et al.

[11] Patent Number: 5,192,419

[45] Date of Patent: Mar. 9, 1993

[54] METHOD FOR PRODUCING A ZINC SELENIDE BLUE LIGHT EMITTING DEVICE

[75] Inventors: Koichi Matsuura; Fuminori Takeda, both of Tottori; Kenichi Kurisu, Osaka, all of Japan

[73] Assignee: Sumitomo Electric Industries, Ltd., Osaka, Japan

[21] Appl. No.: 765,425

[22] Filed: Sep. 25, 1991

[30] Foreign Application Priority Data

Sep. 25, 1990 [JP] Japan .................. 2-255923

[51] Int. Cl.$^5$ .................. C25D 3/56; C25D 7/12
[52] U.S. Cl. .................. 205/244; 205/123; 205/157
[58] Field of Search .................. 205/244, 123, 157; 106/1.16

[56] References Cited

U.S. PATENT DOCUMENTS

| 4,256,544 | 3/1981 | Kazacos et al. | 205/62 |
| 4,388,483 | 6/1983 | Basol et al. | 205/157 |
| 4,536,260 | 8/1985 | Cocivera | 205/224 |
| 4,626,322 | 12/1986 | Switzer | 205/157 |

OTHER PUBLICATIONS

Akimoto et al, "Injection Luminescence in Oxygen-Doped ZnSe Grown by Molecular Beam Epitaxy" Journal of Crystal Growth 101 (1990) pp. 1009-1012.

Akimoto, et al, "Electroluminescence in an Oxygen-Doped ZnSe p-n Junction Grown by Molecular Beam Epitaxy" Japanese Journal of Applied Physics, vol. 28, No. 4, Apr. 1989, pp. L 531-L 534.

Singh et al, "Electrosynthesis and Photoelectroactivity of Polycrystalline p-Zinc Selenide" Phys. Stat. Sol. (a) 99, (1987).

Migita et al, "p-Type Conduction of ZnSe Highly Doped with Nitrogen by Metalorganic Molecular Beam Epitaxy" Journal of Crystal Growth 101 (1990) pp. 835-840.

Takeda et al, "Growth of ZnSe Single Crystals by Sunlimination Method Using Necked Ampoules" Reports of the Faculty of Engineering Tottori University, vol. 13, Jun. 11, 1982, pp. 56-59.

Nishizawa et al, "p-Type Conduction in ZnSe Grown by Temperature Difference Method Under Controlled Vapor Pressure", J. Appl. Phys. 59(6), Mar. 1986, pp. 2256-2258.

Primary Examiner—John Niebling
Assistant Examiner—Brian Bolam
Attorney, Agent, or Firm—Cushman, Darby & Cushman

[57] ABSTRACT

A p-type ZnSe bulk or film crystal of good quality has not been produced so far, although various improved methods based on MOCVD or MBE methods have been tried. Prior art required high pressure, high temperature or high vacuum to grow a p-type ZnSe crystal. This invention grows p-type ZnSe by an electrochemical deposition method. A zinc anode and a low-resistivity n-type ZnSe singlecrystalline substrate are immersed into a solution including zinc ions, selenium ions and acceptor ions. Direct current is sent from the zinc anode to the n-type ZnSe singlecrystalline substrate cathode. Selenium ions and zinc ions are attracted to the n-type ZnSe cathode. They are reduced and are deposited on the n-type ZnSe cathode. Deposited ZnSe film is a p-type semiconductor. A ZnSe semiconductor with a pn-junction is obtained.

2 Claims, 3 Drawing Sheets $J = J_0 \exp(qV/nkT)$

METHOD FOR PRODUCING A ZINC SELENIDE BLUE LIGHT EMITTING DEVICE

FIELD OF THE INVENTION

This invention relates to a method for producing a blue light emitting device using ZnSe.

BACKGROUND OF THE INVENTION

Infrared, red, orange, yellow and green light emitting diodes have been already produced and used on a large scale in various fields of applications. However, blue light emitting diodes have not been put to practical use yet. This is owing mainly to the restriction of material.

General requirements demanded for the material of the blue light emitting diodes are (1) the band gap of the material should be wider than 2.5 eV, (2) the material should have direct transition type band structure; an electron at the bottom of the conduction band can transit to the top of the valence band without generation on absorption of phonon, (3) the pn-junctions should easily be fabricated, (4) large substrates should easily be produced, (5) the device processes should be facile, So far gallium nitride (GaN), silicon carbonate (SiC), zinc selenide (ZnSe), zinc sulphide (ZnS), gallium aluminum nitride (GaAlN), and zinc sulfo-selenide (ZnSSe) have been proposed as the materials for blue light emitting diodes which satisfy some of the requirements.

Among them, zinc selenide (ZnSe) is a promising semiconductor, because ZnSe has a wide band gap of 2.7 eV and it is a direct transition type semiconductor. However, ZnSe has drawbacks that growing a large bulk singlecrystal ZnSe with few defects is difficult and a p-type ZnSe cannot be produced yet.

High pressure Bridgman method, sublimation method, iodide transportation method, growth-in-solution method, Piper's method and so forth have been proposed to grow bulk ZnSe singlecrystals. What makes it difficult to grow ZnSe singlecrystals is that ZnSe should be grown at high temperature under high pressure, since ZnSe vehemently sublimes at high temperature. In order to melt material solid ZnSe suppressing sublimation, man must heat the material solid ZnSe above 1520° C. under pressure more than 50 atm (5 MPa).

The Inventors had proposed an improvement of sublimation method for growing a ZnSe singlecrystal for substrates. This method made use of sublimation of ZnSe in an ample having two spaces and a neck connecting the two spaces in a gradient of temperature. The method comprised the steps of storing ZnSe polycrystal in one space of the ample, sealing the ample, heating the ample in a furnace having a gradient of temperature so as to position the solid ZnSe at the higher temperature zone, subliming the solid ZnSe little by little into a ZnSe gas and recrystallizing the gas ZnSe into a ZnSe crystal at the lower temperature zone. Since the ZnSe gas was transported from the higher temperature zone to the lower temperature zone through the neck by the gradient of temperature, this method was called a transportation method. The ZnSe singlecrystal obtained by their improved method was an insulator with high resistivity. However, an n-type semiconductor ZnSe singlecrystal with lower resistivity can be obtained by heat-treating the insulating ZnSe singlecrystal in a zinc melt. This method enables us to grow a pretty large n-type ZnSe singlecrystal.

F. Takeda, A. Matsuda, S. Kishida, K. Matsuura and I. Tsurumi: Report of the Faculty of Engineering. Tottori University, vol. 13, p. 56 (1982)

The improvement succeeded in solving one difficulty of ZnSe devices; making a large singlecrystal ZnSe. However, another serious difficulty still remains. Namely a p-type ZnSe cannot be produced yet ever by our improvement. No effective solution has proposed yet concerning the fabrication of p-type ZnSe singlecrystals.

No pn-junction will not be fabricated, if a p-type singlecrystalline ZnSe film cannot be grown on an n-type singlecrystalline ZnSe substrate. Without pn-junction, no blue light emitting diode of ZnSe can be produced.

Man has tried various methods, e.g. a solution growth method or a vapor phase deposition method, for fabricating p-type ZnSe singlecrystals.

J. Nishizawa et al. reported that they had succeeded in fabricating a p-type bulk ZnSe singlecrystal by a temperature difference method under controlled vapor pressure (TDM-CVP). According to the report, the method comprised the steps of laying ZnSe solid material on the selenium (Se) melt under the saturation vapor pressure of zinc, doping lithium (Li) as a p-type dopant into the selenium (Se) melt, growing a p-type ZnSe singlecrystal at 1050° C. under 7.2 atm (0.72 MPa).

J. Nishizawa and R. Suzuki, J. Appl. Phys. 59(6), 15, (1986) p. 2256

However, they have succeeded only once in growing the p-type ZnSe by the method. Nobody except them has succeeded in growing one by the same method so far. Thus the method has not been confirmed by anybody yet. Since it was very difficult to make a p-type ZnSe bulk crystal, man has tried to make p-type ZnSe film crystals on some proper substrates. Recently trials based on the MOCVD (metalorganic chemical vapor deposition) method or the MBE (molecular beam epitaxy) method have been done.

K. Akimoto, T. Miyajima and Y. Mori: J. Crystal Growth 101 (1990) 1009-1012.

K. Akimoto, T. Miyajima and Y. Mori: Jpn. J. Appl. Phys., vol. 28, No. 4, (1989) L531-534.

These papers reported that a Ga-doped ZnSe (n-type) or an O-doped ZnSe (p-type) was grown on an n-type gallium arsenide (GaAs) substrate by the MBE method. Since they could not obtain a bulk ZnSe singlecrystal of good quality, they used a gallium arsenide (GaAs) singlecrystal as a substrate. They alleged that oxygen (O) plays a role of an acceptor in the ZnSe film they made. The growth of ZnSe was done at 240° C.

M. Migita, A. Taike, M. Shiiki and H. Yamamoto: J. Crystal Growth 101 (1990) p. 835

Mr. Migita et al. reported in the paper that non-doped ZnSe films and N-doped ZnSe had been grown on n-type gallium arsenide (GaAs) substrates by the MOCVD method. The temperature of growth was 250° C. to 450° C. The non-doped ZnSe film turned out to be n-type. They supposed that chloride which had been included a little in the material gas would convert the non-doped ZnSe into an n-type one.

These vapor phase growing methods enable us to grow ZnSe crystal films with low defect density and low impurity concentration at low temperature between 300° C. and 400° C. considerably lower than the melting point of ZnSe by using gallium arsenide wafers as a substrate.

However, even these improved vapor phase growing methods (MOCVD, MBE) have not succeeded in providing a p-type ZnSe of sufficiently good quality. Up to the present there is no blue light emitting diode made from ZnSe which works enough at room temperature.

Unlike these vapor phase growing methods, Singh et al. reported that p-type ZnSe polycrystals had been grown by an electrochemical method.

K. Singh and J. P. Rai: Phys. stat. sol. (a) 99, 257 (1987) p. 257

According to their teaching, the electrochemical method comprised the steps of coating one surface and four sides of a titanium (Ti) plate of 1.3 cm by 1.3 cm with an insulator except the other surface left uncoated, immersing the half-coated titanium plate into a solution of

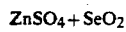

$ZnSO_4 + SeO_2$ supplying current for 4 hours through the solution and the titanium plate and depositing a ZnSe polycrystal up to a thickness of 5 μm on the uncoated surface of the titanium plate.

The device fabricated by the electrochemical processes has a structure of Ti/ZnSe which is a junction of a metal and a semiconductor. It is not a diode in any way. Singh et al. immersed the Ti/ZnSe plate and a platinum plate as electrodes into a solution of

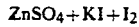

$ZnSO_4 + KI + I_2$ and measured photovoltaic effect, capacitance of the Ti/ZnSe plate. Furthermore, they observed the response of the Ti/ZnSe plate to X-ray irradiation. They concluded that the ZnSe specimen they made was a p-type polycrystal with considerable photovoltaic effect. However, they could not clarify why the method could make a p-type ZnSe, what could endow the ZnSe with p-type character and what were the acceptors in the ZnSe. The purpose of their attempt was the application of ZnSe semiconductor to photodectors. Although they might succeed in growing a p-type ZnSe polycrystal by the electrochemical deposition method, they failed in making a pn-junction of ZnSe because the substrate was not a ZnSe substrate but a titanium substrate. The Ti/ZnSe specimen could not be a diode, because it lacked a pn-junction. The Ti/ZnSe specimen emitted no light.

Thus, the Ti/ZnSe specimen could be applied neither to a light emitting diode nor a photodiode.

In the case of growing p-type ZnSes by the MOCVD method or the MBE method, a temperature for growth is 300° C. to 400° C., which is still considerably high temperature, although it is far lower than the melting point of ZnSe. High temperature of growth is likely to induce a lot of defects and impurities into a growing ZnSe film which reduce the quality of the film. Furthermore, conventional methods for making p-type ZnSe films require in general such conditions as high pressure, high vacuum or high temperature. These severe conditions demand large scale growing apparatuses.

The purpose of this invention is to provide a method for producing a blue light emitting diode having a pn-junction of ZnSe semiconductor with few defects and impurities at low temperature by a simple apparatus.

SUMMARY OF THE INVENTION

To accomplish the purpose, this invention uses n-type ZnSe singlecrystalline substrates instead of gallium arsenide substrates which have been used as substrates for growing ZnSe crystal film in prior art. Furthermore, this invention employs wet processes in a solution instead of dry processes in vapor phase which are the main current of prior art.

Namely, this invention provides a method for producing a ZnSe blue light emitting device comprising the steps of preparing a solution including zinc ions, selenium ions and acceptor ions, immersing a low resistant n-type ZnSe singlecrystalline substrate and a zinc electrode into the solution being kept between room temperature and 70° C., sending an electric current from the zinc electrode as an anode to the n-type ZnSe singlecrystalline substrate as a cathode, depositing a p-type ZnSe film on the n-type ZnSe singlecrystalline substrate, and forming electrodes on the p-type ZnSe film and on the n-type ZnSe singlecrystalline substrate. In brief, this invention deposits a p-type ZnSe film on an n-type ZnSe substrate by an electrochemical deposition method. This method can produce a pn-junction for the first time. Since a pn-junction can be made, a ZnSe light emitting diode can be easily fabricated by forming electrodes on the p-type ZnSe film and on the n-type ZnSe substrate.

The function of this invention will be explained. The method of this invention deposits a p-type ZnSe film on a ZnSe substrate by immersing a zinc electrode and the ZnSe substrate in a solution including zinc (Zn) ions, selenium (Se) ions and acceptor ions and supplying current from the zinc anode to the ZnSe substrate cathode.

There are $SeSo_3$ ions as cations and zinc (Zn) ions as cations in the solution. A p-type dopant is also included as ions in the solution.

Since a direct current voltage is applied between the ZnSe cathode and the zinc anode, $SeSO_3$ ions are attracted to the ZnSe cathode. Being in contact with the ZnSe cathode, $SeSO_3$ ions are reduced by receiving electrons from the ZnSe cathode. By the reduction, Se ions are dissociated from $SeSO_3$ ions. Similarly, zinc ($Zn^{2+}$) ions are attracted by the ZnSe cathode. Then Se ions and zinc (Zn) ions are absorbed by the ZnSe cathode. Missing positive charge by receiving electrons, Zn atoms and Se atoms are deposited on the ZnSe cathode. A ZnSe is synthesized with a Zn ion and a Se ion on the ZnSe cathode. A ZnSe film grows in a solution. Dopant ions which are attracted by the electric field also attain to the ZnSe cathode and adhere to it. Therefore, ZnSe with dopant atoms covers the surface of the ZnSe cathode. The crystal growth of ZnSe of this invention can be sufficiently proceeding at room temperature to 70° C., because it is a wet process in a solution.

The method of this invention does not require high pressure, high vacuum, high temperature or other difficulties. Thus the apparatus for this method is very simple.

DETAILED DESCRIPTION OF THE EMBODIMENT

Figure 1:
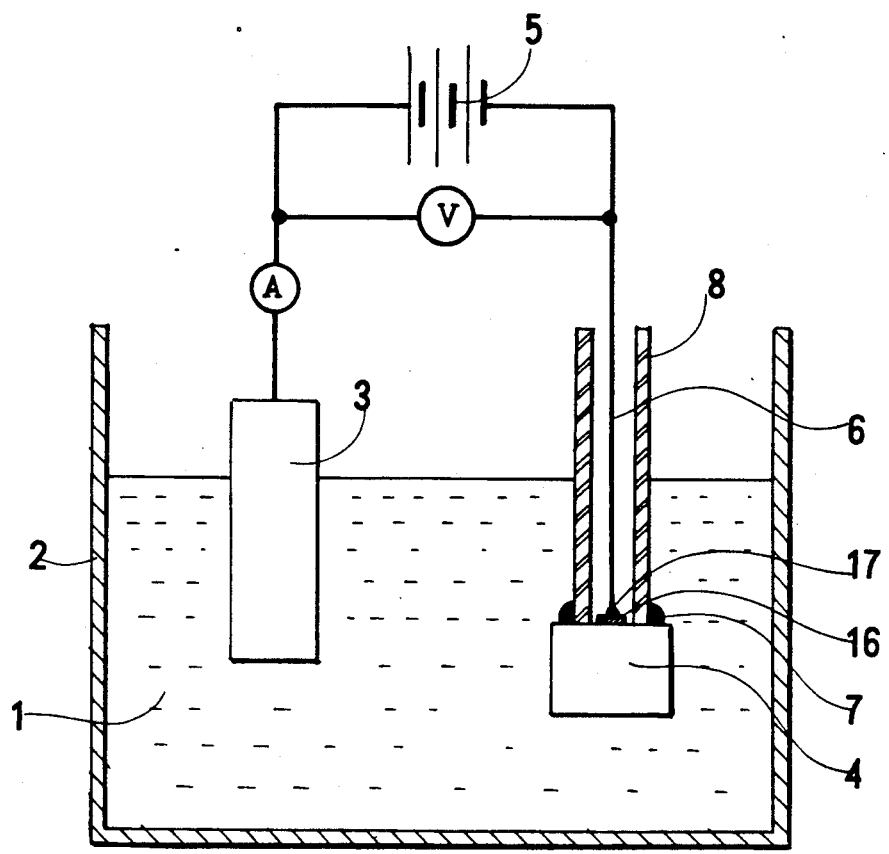
FIG. 1 is a sectional view of an apparatus for putting the method of this invention into practice.

An embodiment of this invention will be explained by referring to FIG. 1. A solution (1) is contained in a beaker (2). A zinc plate as an anode (3) and an n-type ZnSe singlecrystal as a cathode (4) are immersed in the solution. A power source (5) sends direct current from the zinc anode (3) to the n-type ZnSe cathode (4). The voltage applied between the zinc anode (3) and the n-type ZnSe cathode (4) is monitored by a voltmeter. The current flowing from the zinc anode (3) to the n-type ZnSe cathode (4) is also monitored by an ammeter. A bottom end of a glass tube (8) is glued to the upper surface of the n-type ZnSe cathode (4) by varnish (7). A platinum wire (6) is connected to the n-type ZnSe cathode (4). Since the platinum wire (6) is enclosed by the glass tube (8), the wire (6) is not in contact with the solution (1).

The solution (1) is a material solution including zinc ions, selenium ions and p-type dopant ions. The method for preparing the material solution is now explained.

First, sodium sulfite ($Na_2SO_3 \cdot 7H_2O$), selenium (Se) and water ($H_2O$) are mixed in a weight ratio;

$$Na_2SO_3 \cdot 7H_2O:Se:H_2O = 11.3:0.24:60 \text{ (wt)}$$

The solution is mixed by stirring for about 24 hours at 50° C. to 60° C. Then selenium sulfite ($SeSO_3$) ions are produced. This is a colorless, transparent liquid. Then $Na_2$—NTA and $ZnCl_2$ (zinc chloride) are mixed into the solution in a weight ratio; the solution: $Na_2$—NTA: $ZnCl_2 = 1:0.27:0.17$ (wt)

Here NTA is a shortened expression of nitrilotriacetic acid which has a molecular structure of $N(CH_2COOH)_3$. Instead of NTA, it is often written as $H_3$—NTA. $Na_2$—NTA is a material which is produced from NTA by replacing two of three hydrogen atoms by two sodium atoms. $Na_2$—NTA has a molecular structure of $N(CH_2COONa)_2(CH_2COOH)$. It is supposed that $Na_2$—NTA will be converted to 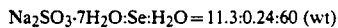 $N(CH_2COO)_2Zn(CH_2COOH)$ in a solution including zinc ions ($Zn^{2+}$) by replacing two sodium ions by a zinc ion.

Then the material solution (1) which has been prepared by the processes mentioned is poured into the quartz beaker (2). A zinc (Zn) plate and a low-resistant n-type ZnSe singlecrystal are immersed into the material solution (1). The zinc (Zn) plate (3) as an anode and the n-type ZnSe singlecrystal (4) as a cathode are connected to the direct current power source (5).

The size of the low-resistivity n-type ZnSe singlecrystal is 3 mm × 3 mm × 1 mm. It has been prepared by the improved sublimation method and the zinc melt heat treatment method.

The platinum wire (6) is connected to the ZnSe singlecrystal of indium (In) is glued to one surface of the n-type ZnSe singlecrystal. The In-glued ZnSe singlecrystal is heat-treated for a few minutes in hydrogen ($H_2$) atmosphere at 400° C. Since indium diffused into the ZnSe crystal during the heat treatment, an ohmic contact In electrode (16) is obtained. A platinum wire (6) is connected to the ohmic contact In electrode (16) by Ag (silver) paste (17). Thus the platimun wire (6) forms an ohmic contact with the n-type ZnSe singlecrystal.

The varnish (7) and the glass tube (8) have a role for protecting the contact from the material solution (1). The solution (1) is so alkaline (pH = 11) that the contact would be corroded, if it were not protected by the glass tube (8) and the varnish (7).

The temperature of the material solution (1) is kept to be room temperature to 70° C. The most preferably temperature is 60° C. Direct current voltage of 0.2 V to 0.5 V is applied between the zinc anode (3) and the ZnSe cathode (4) for two hours so as to send direct current of 20 $\mu$A to 50 $\mu$A between the electrodes (3) and (4). The time for sending current can be increased or decreased in the range between one hour and five hours.

In the meantime, lithium hydroxide (LiOH) of 0.1 g and ammonia ($NH_3$) of 3 cc (30 wt %) can be added into the material solution (1).

Figure 2:
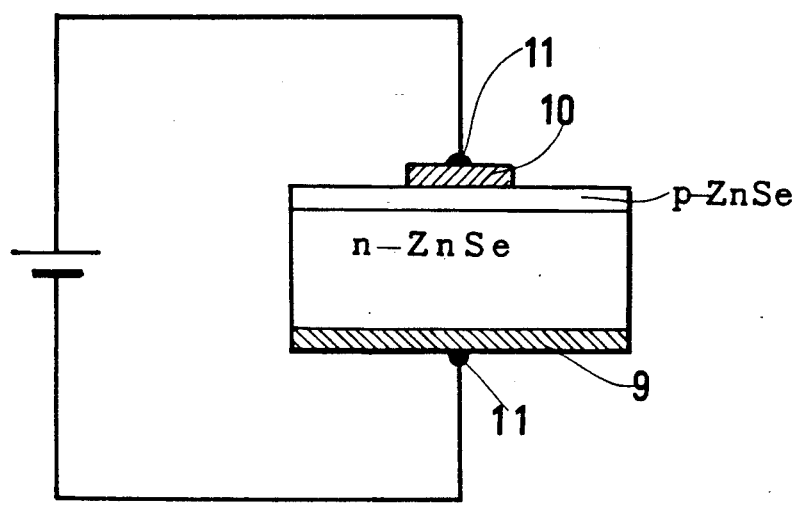
FIG. 2 is a sectional view of a ZnSe diode produced by the method of the invention.

By the electrochemical deposition method, a p-type ZnSe film is deposited on the n-type ZnSe singlecrystal cathode (4). Thus a ZnSe crystal having a pn-junction is produced. A round gold (Au) electrode (10) with a diameter of 0.9 mm is formed on the p-type ZnSe film by evaporation coating. A light emitting diode shown in FIG. 2 is obtained.

Figure 3:
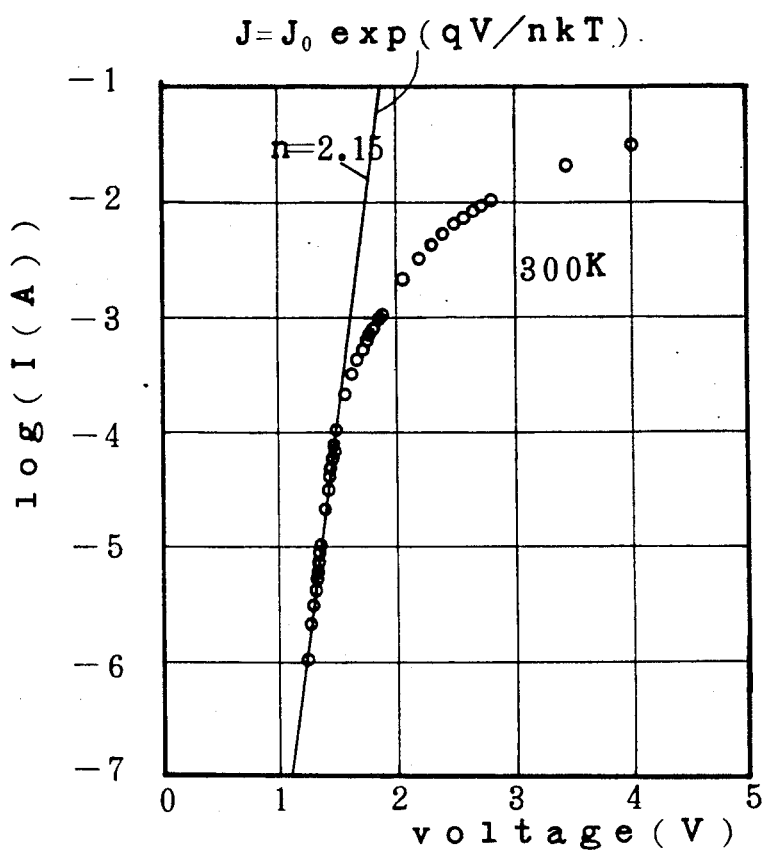
FIG. 3 is a graph showing the relation between voltage and current (current is shown in logarithmic scale) of the ZnSe diode produced by this invention.

Forward voltage-current property of the light emitting diode is measured. FIG. 3 shows the result. In the figure, the abscissa shows the voltage (V) and the ordinate shows the current in a logarithmic scale; log I (A). A straight line drawn in FIG. 3 shows the current-voltage relation in which current is expressed by exp $\{qV/nkT\}$ and n=2.15 is substituted to the equation. For the applied voltage less than 1.5 V, the result of the measurement coincides well with the equation substituted with n=2.15. But for the voltage more than 1.5 V, the curve deviates downward from the equation with n=2.15. An ideal diode will satisfy the equation substituted with n=2. Since the relation between voltage and current of this diode is akin to the equation substituted with n=2 at low voltage, the diode shall have a good current-voltage property of diode.

Figure 4:
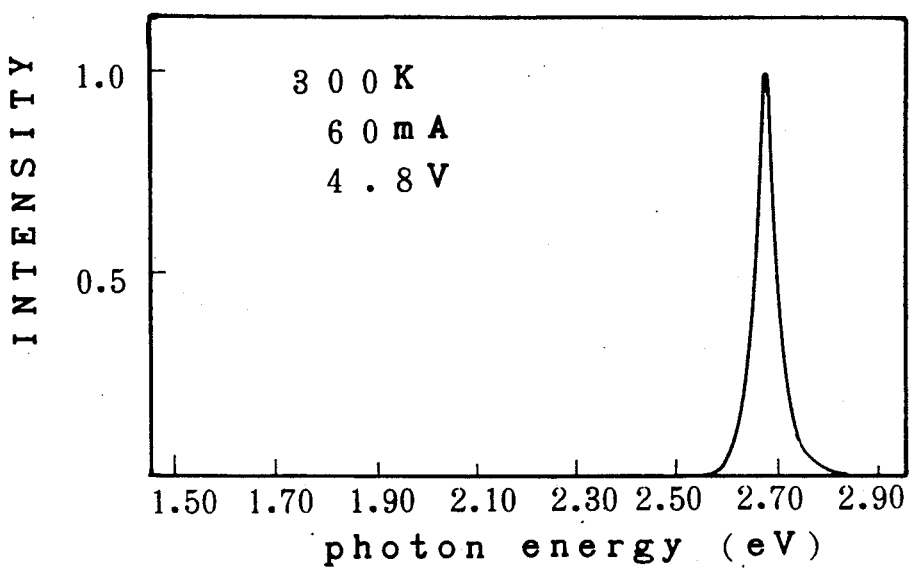
FIG. 4 is a graph showing the spectrum of the light emitted from the ZnSe diode produced by this invention.

In order to investigate the optoelectronic property of the ZnSe diode, direct current of 60 mA is sent to the diode under the voltage of 4.8 V at 300K. The diode surely emits blue light. FIG. 4 shows the spectrum of the light emitted from the diode. The abscissa shows the photon energy (eV). The ordinate shows the intensity of light (arbitrary unit). The light is blue light having a sharp peak at a wavelength of 463 nm (at photon energy of 2.68 eV) in the spectrum. Full width of the half maximum the peak of the blue light is 52 meV. It is confirmed that this diode produced by the invention workds as a blue light emitting diode. Then what mechanism does produce the blue light in the ZnSe diode? What is the origin of the blue light? The origin of the blue light emission may be attributed to either of the following four grounds;

①  interband direct transition (an electron transits from the bottom of the conduction band to the top of the valence band without change of wavenumber: or recombination of a free electron and a free hole)

②  recombination of a free exciton

③ recombination of a donor electron and a free hole (where a donor electron means an electron captured in a donor level which is slightly lower than the bottom of the conduction band)

④ recombination of a free election and an acceptor hole (where an acceptor hole means a hole captured in an acceptor level which is slightly higher than the top of the valence band).

The peak values of energy of photons which should be emitted from the four grounds are theoretically calculated, by assuming as follows, energy gap: $E_g = 2.713$ eV
donor level: $E_d = 0.02$ eV
acceptor level: $E_a = 0.11$ eV Unfortunately, the result of experiment shown in FIG. 4 coincides with none of four peak values calculated from the assumption and based upon the four grounds.

However, the Inventors suppose that the light emission may be induced by recombination of a free exciton, although the actual peal value is lower than the theoretical peak value calculated on the ground of recombination of a free exciton. Perhaps the height of a higher energy side of the peak should be suppressed by self absorption. Then if the self absorption of light did not happen, the peak value of the experiment would slightly be removed toward a higher energy side.

Figure 5:
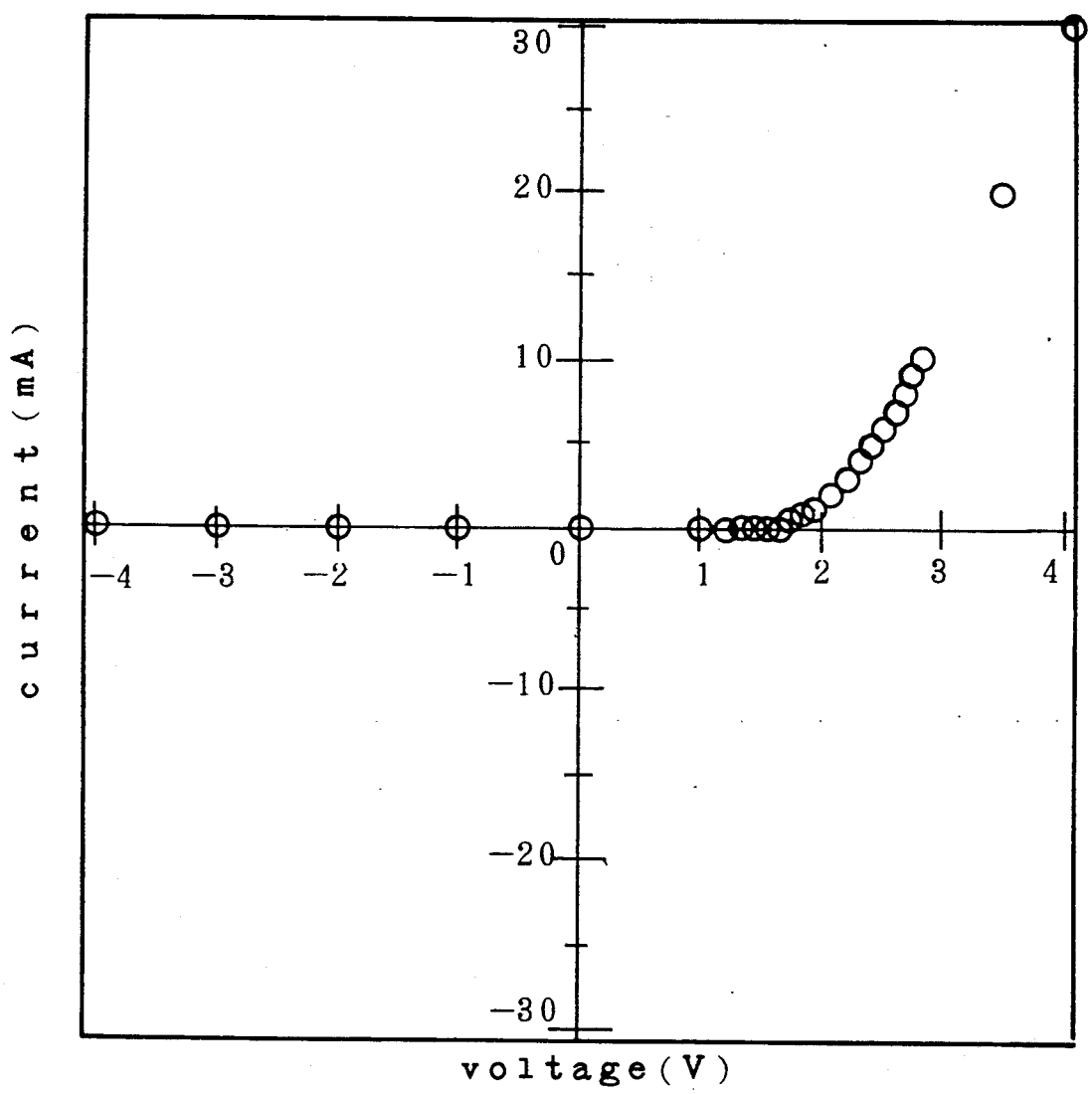
FIG. 5 is a graph showing the relation between voltage and current of the ZnSe diode produced by this invention.

Furthermore, the rectifying property of the diode is measured by applying forward voltage and reverse voltage to the diode. FIG. 5 shows the relation between the voltage and the current of the diode. The abscissa shows voltage (V). The ordinate shows current (mA) in a normal scale. The data between the forward voltage and the forward current are entirely identical with the data shown in FIG. 3, although they seem different at a glimpse because of the logarithmic scale in FIG. 3. But the data between the reverse voltage and the current of FIG. 5 are not shown in FIG. 3. FIG. 5 shows that no current flows when reverse voltage is applied at least till $-4$ V. FIG. 5 signifies good rectifying performance. Since the diode exhibits good rectifying property and the substrate is a n-type semiconductor, the grown ZnSe film must be a p-type semiconductor.

Since the grown ZnSe film is a p-type semiconductor, it must have a p-type dopant in it. But the Inventors cannot still identify what is the p-dopant in the grown ZnSe crystal. It is assumed that sodium (Na) or lithium (Li) may become a p-type dopant in the ZnSe crystal, because the material solution has no element which would act as a p-type dopant in a ZnSe crystal except sodium (Na) or lithium (Li).

This invention enables us to produce a p-type ZnSe crystal of good quality which conventional methods have failed to produce, on a n-type ZnSe substrate at low temperature between room temperature and 70° C. with a simple apparatus. This invention does not require high pressure, high vacuum nor high temperature. By the invention, a p-type ZnSe can be produced even at room temperature under atmospheric pressure. Since a pn-junction of ZnSe is able to be produced by the electrochemical deposition method of this invention, a blue light emitting device can easily be fabricated.

What we claim is:

1. A method for producing a ZnSe blue light emitting device comprising the steps of:

mixing sodium sulfite ($Na_2SO_3$), selenium (Se) and water ($H_2O$) to produce a selenium sulfite ($SeSO_3$) solution;

mixing sodium nitrilotriacetic acid ($Na_2$—NTA) and zinc chloride ($ZnCl_2$) with the selenium sulfite solution to prepare a material solution;

connecting a platinum wire to a low-resistivity n-type ZnSe singlecrystal substrate;

immersing the low-resistivity n-type ZnSe singlecrystal substrate and a zinc electrode into the material solution being kept between room temperature and 70° C.;

sending an electric current from the zinc electrode as an anode to the n-type ZnSe singlecrystalline substrate as a cathode;

depositing a p-type ZnSe film on the n-type ZnSe singlecrystalline substrate; and forming electrodes on the p-type ZnSe film and on the n-type ZnSe singlecrystalline substrate.

2. A method for producing a ZnSe blue light emitting device comprising the steps of:

mixing sodium sulfite ($Na_2SO_3$), selenium (Se) and water ($H_2O$) to produce a selenium sulfite ($SeSO_3$) ion solution;

mixing sodium nitrilotriacetic acid ($Na_2$—NTA) and zinc chloride ($ZnCl_2$) with the selenium sulfite solution to produce a second solution including zinc ions and selenium sulfite ions;

adding ammonia and lithium hydroxide to the second solution to prepare a material solution;

connecting a platinum wire to a low-resistant n-type ZnSe singlecrystalline substrate;

immersing the low-resistivity n-type ZnSe singlecrystalline substrate and a zinc electrode into the material solution being kept between room temperature and 70° C.;

sending an electric current from the zinc electrode as an anode to the n-type ZnSe singlecrystalline substrate as a cathode;

depositing a p-type ZnSe film on the n-type ZnSe singlecrystalline substrate; and forming electrodes on the p-type ZnSe film and on the n-type ZnSe singlecrystalline substrate.

* * * * *